(12) United States Patent
Valentine et al.

(10) Patent No.: US 6,822,162 B1
(45) Date of Patent: Nov. 23, 2004

(54) MICROCIRCUIT HOUSING WITH SLOPED GASKET

(75) Inventors: Roger L. Valentine, Santa Rosa, CA (US); Anthony R. Blume, Santa Rosa, CA (US); Michael J. Neumann, Milwaukee, WI (US); Adam E. Robertson, Rohnert Park, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/704,402

(22) Filed: Nov. 7, 2003

(51) Int. Cl.[7] ............................................. H05K 9/00
(52) U.S. Cl. ........................ 174/35 GC; 257/698; 257/728; 257/704
(58) Field of Search ..................... 257/698, 699, 257/708, 728, 704; 174/35 R, 35 GC; 361/816, 818

(56) References Cited

U.S. PATENT DOCUMENTS

| 4,167,647 | A | * | 9/1979 | Salera ........................ 174/52.4 |
| 4,590,617 | A | * | 5/1986 | Kraemer ...................... 455/328 |
| 6,028,497 | A | * | 2/2000 | Allen et al. .................. 333/246 |
| 6,498,551 | B1 | * | 12/2002 | Ammar et al. .............. 333/247 |
| 6,653,916 | B2 | * | 11/2003 | Ammar et al. .............. 333/246 |

FOREIGN PATENT DOCUMENTS

JP        10107475     *   4/1998

* cited by examiner

*Primary Examiner*—Hung V. Ngo

(57) ABSTRACT

A contiguous gasket provides an electromagnetic and environmental seal between the base and lid of a microcircuit housing. The base has a flat surface that allows easy access of tools for assembling electronic components. Channels are cut into a corresponding flat portion of the lid to accommodate the electronic components mounted on the base. High-frequency feedthroughs are brought through sidewall connector features of the base that rise above the assembly surface. Feedthroughs are optionally brought through the flat portion of the base as well. When the microcircuit housing is assembled, the lid compresses the gasket against the base to form an electromagnetic and environmental seal.

19 Claims, 4 Drawing Sheets

US 6,822,162 B1

MICROCIRCUIT HOUSING WITH SLOPED GASKET

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO MICROFICHE APPENDIX

Not applicable.

FIELD OF THE INVENTION

The present invention relates generally to packaging for high-frequency microcircuits, and more particularly to gaskets providing an environmental and electromagnetic seal in a microcircuit package.

BACKGROUND OF THE INVENTION

FIG. 1A shows a perspective view of a base 12 of a prior art microcircuit package used for housing microwave and millimeter-wave circuits, which will be referred to as "high-frequency microcircuits" for purposes of discussion. The base 12 is machined from a block of metal, such as aluminum alloy. Cavities 14 and channels 16 are machined into the base 12 to accept and interconnect various types of electronic components, such as thickfilm or thinfilm substrates, monolithic microwave integrated circuits ("MMICs"), and beam-lead devices (not shown). This type of microcircuit package is often referred to as a "canyon-style" package. Electrical components are typically secured to the floor of the base with epoxy and interconnected using wire-bond, mesh-bond, and ribbon-bond techniques.

Electrical signals are brought into the high-frequency microcircuit through feedthroughs 18, 20 mounted on a bottom 22 or side 24 of the base. High-frequency feedthroughs, such as the feedthrough 20 on the side 24 of the base 12, typically have a coaxial structure, with a center conductor lying along the central axis of the feed-through. The center conductor of the high-frequency feed-through is electrically coupled to the center conductor of a planar microcircuit or other electronic component in a coaxial-to-planar connection. The outer conductor of the high-frequency feedthrough is electrically coupled to the package housing, which serves as electrical ground.

At millimeter-wave frequencies, broadband coaxial-to-planar transitions perform best if the coaxial connector axis lies in the same plane as the planar microcircuit to avoid impedance mismatch and electromagnetic leakage. This is commonly known as an in-line launch. The base 12 is sufficiently thick to allow integrating coaxial high-frequency feedthroughs for in-line launch configurations. The base 12 has a planar surface 26 to accommodate a flat gasket (see FIG. 1B, ref. no. 28) that is placed on the base 12 to seal the perimeter of the base when a lid is attached.

FIG. 1B shows a cross section of a portion of a prior art microcircuit package 10. A flat gasket 28 is held between a planar lid 30 and the base 12. The flat gasket is typically made of a compliant material, such as silicon rubber loaded with carbon powder, that provides a degree of electromagnetic shielding to the electronic components within the microcircuit package, as well as an environmental seal. Screws (not shown) compress the flat gasket 28 between the planar lid 30 and the base 12 when the screws are tightened.

Unfortunately, it is difficult to assemble high-frequency microcircuits inside the channels and cavities of a canyon-style package.

BRIEF SUMMARY OF THE INVENTION

A base of a microcircuit housing (package) has a flat base portion transitioning into a sidewall connector feature. The lid of the microcircuit housing has a corresponding flat lid portion transitioning into a sloped lid portion. A contiguous gasket is compressed against the lid between both the flat portion of the base and the sidewall connector feature when the microcircuit housing is assembled. The gasket is formed from a conductive elastomer, such as by stamping, injection molding, or die cutting. Stops are optionally included on the base and/or lid to limit the proximity of the base to the lid to avoid overcompression of the gasket. The gasket provides an electromagnetic and environmental seal between the base and the lid. In a further embodiment, a high-frequency feedthrough extends through the sloped base portion and is coupled to an electronic component mounted on the flat base portion. In a particular embodiment, a face of the sidewall connector feature slopes at an angle between 30 degrees and 60 degrees, relative to a perpendicular of the flat base portion to avoid undesired distortion or damage to the gasket.

DETAILED DESCRIPTION OF THE EMBODIMENTS

I. Introduction

Embodiments of the present invention use a shaped gasket to seal a microcircuit housing, also known as a microcircuit package. The base of the microcircuit housing is flat (i.e. planar), enabling superior access for assembly and testing of the microcircuit. High-frequency feedthroughs are brought through sidewall connector features on the edge of the base that have a face portion sloping toward the flat portion of the base. The flat portion of the base transitions to the sloped face of the sidewall connector feature, which allows the shaped gasket to seal both the flat and sloped portions when a lid is secured to the base.

II. Exemplary Microcircuit Housings

Figure 2A:
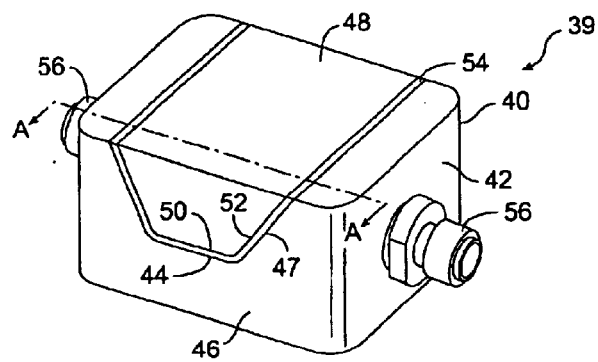
FIG. 2A shows a perspective view of a microcircuit with a microcircuit housing according to an embodiment of the present invention.

FIG. 2A shows a perspective view of a microcircuit 39 with a microcircuit housing 40 according to an embodiment of the present invention. The microcircuit housing 40 has a base 42 with a flat base portion 44 that transitions to a face 47 of a sidewall connector feature 46 that slopes up from the flat base portion. A lid 48 has a corresponding flat lid portion 50 transitioning into a sloped lid portion 52. A gasket 54 is contiguous between the flat base portion 44 and the face 47 of the sidewall connector feature 46. Screws (see FIG. 2C, ref. num. 62) hold the microcircuit housing 40 together. When the screws are tightened, the gasket 54 is compressed between the base 42 and lid 48 to form an environmental and electromagnetic seal. The sidewall connector feature 46 is a structure that accommodates high-frequency feedthroughs 56, and can be integrated with the base (as shown), or attached to the base (see, e.g. FIG. 3A, ref. num. 46'). High-frequency feedthroughs couple electronic signals to and from electronic components (not shown) inside the microcircuit housing 40. Although two high-frequency feedthroughs are shown, the number of high-frequency feedthroughs is arbitrary, and some embodiments have a single sidewall connector feature and associated high-frequency connector.

The high-frequency feedthroughs 56 extend through the sidewall connector features 46, allowing an in-line launch to a planar high-frequency circuit (see FIG. 2C, ref. num. 58) or other electronic component mounted on the flat portion 44 of the base 42.

Figure 2B:
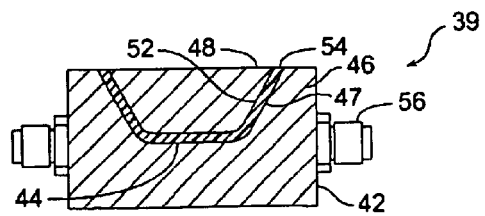
FIG. 2B shows a cross section of the microcircuit housing of FIG. 2A.

FIG. 2B shows a cross section of the microcircuit 39 of FIG. 2A taken along section line A—A. The sidewall connector feature 46 has a face 47 with an angle between 30 degrees and 60 degrees, relative to the flat base portion 44 of the base 42. The gasket 54 tends to bind and distort with a greater (i.e. more vertical) slope. A lesser slope tends to undesirably extend the sidewall connector feature in order to provide sufficient height to accommodate the high-frequency feedthrough 56. If the slope is too shallow, the center pin of a standard high-frequency feedthrough might not reach the intended component.

Figure 2C:
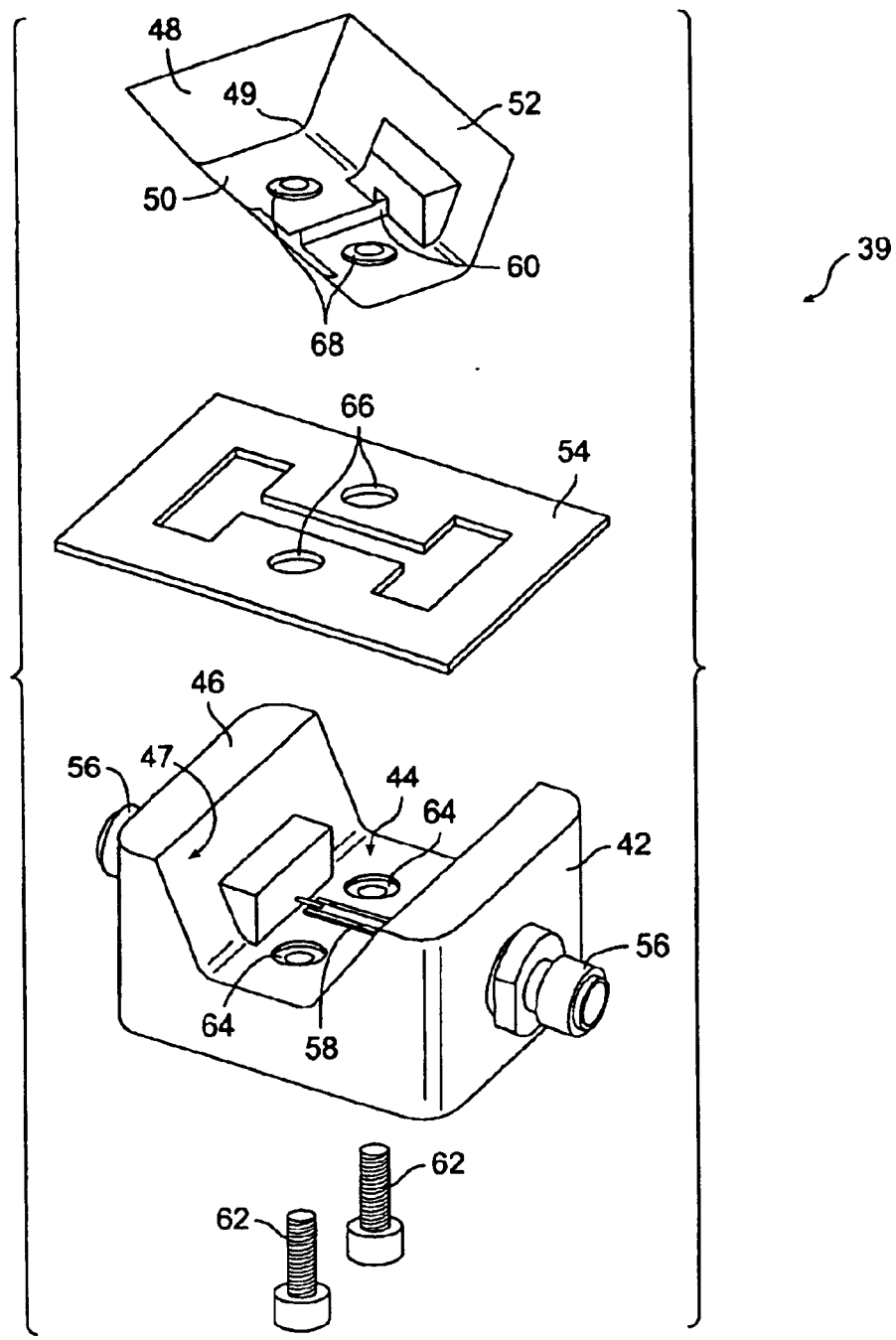
FIG. 2C shows an exploded view of the microcircuit housing of FIGS. 2A and 2B.

FIG. 2C shows an exploded view of the microcircuit 39 of FIGS. 2A and 2B. The gasket 54 is stamped from a sheet of electrically conductive elastomer, such as is available from CHOMERICS NORTH AMERICA of Woburn, Mass. In a particular embodiment, the electrically conductive elastomer includes nickel-plated carbon fibers dispersed in a silicon rubber base. This material was found to provide higher conductivity and a better electromagnetic seal, particularly at millimeter-wave frequencies, and superior resistance to environmental degradation. Alternatively, the gasket is die-cut or injection molded. The gasket 54 forms a contiguous seal around the perimeter between the base 42 and the lid 48, including around the high-frequency feedthrough 56. The gasket 54 is typically attached to the lid 48 with conductive adhesive before the lid 48 and base 42 are assembled. When the lid 48 and base 42 are assembled, the gasket 54 is compressed between the lid 48 and the base 42, including the face 47 of the sidewall connector feature 46 and the sloped lid portion 52. Alternatively, the gasket is positioned without adhesive, or is secured to the base 42 prior to assembly.

In conventional canyon-style microcircuit housings, the flat gasket does not form a seal around side-mounted high-frequency feedthroughs. In this embodiment of the invention the high-frequency feedthrough 56 passes through an opening in the gasket. The high-frequency feedthrough 56 is coupled to an electrical component 58, such as a thinfilm microstrip transmission line. The flat base portion 44 allows easy access for assembly and test tooling to the electrical component 58. A channel 60 is formed in the flat portion 50 of the lid 48 and the electrical component 58 extends into the channel 60 when the microcircuit housing 40 is assembled, allowing the flat lid portion 50 to press the gasket 54 against the flat base portion 44 to form a perimeter seal without damaging the electrical component 58.

Forming the channel 60 in the lid enables selecting the width and depth of the channel to achieve desired electrical transmission characteristics, rather than having to select the width and depth according to assembly requirements, as with canyon-style housings. In some embodiments the channel width and the channel depth are chosen to form a waveguide with the base and electrical component to prevent or substantially reduce electromagnetic coupling of the electrical component with the package. In many cases, both the width and the depth of the channel 60 are much less than a comparable channel in a canyon-style base, requiring much less removal of material, and enabling faster machining and the use of smaller machine tools. The ceiling of the channel 60 does not have to be smooth and flat for mounting of an electrical component, as with the floor of a channel in a conventional canyon-style base. Furthermore, the width of the channel does not have to be constant, but can vary according to desired electrical transmission characteristics, or to accommodate transmission lines or other components having different widths.

Another advantage of providing the flat base portion 44 is that the areas where the electrical components will be attached is easier to make flat. It is desirable that the area of the base directly underneath an electrical component, particularly a semiconductor or ceramic electrical component be flat and smooth to avoid creating stress points that cause cracking. In a conventional canyon-style base, channels are cut deep into the base, typically on the order of a few millimeters, and a channel having a flat, smooth floor along its entire length is often specified. A relatively large end mill is used to cut such deep channels, or a small end mill is used to make multiple passes, increasing manufacturing time. Often, the width of the end mill is not optimized for the electrical component that will be placed in the channel, but will be significantly wider.

While the mounting area underneath a ceramic component is typically flat and smooth to avoid stress risers that might crack the ceramic, the remainder of the flat base portion 44 does not need such a precise surface, which simplifies fabrication. In a further embodiment, circuit patterns, circuit mounting pedestals, fiducial marks, and other features are also easily machined into the base 42 because relatively little material is removed, typically on the order of a few mils, which allows the use of relatively small end mills.

Screws 62 are inserted through holes 64 in the base 42 and through holes 66 in the gasket 54 and into threaded holes 68 in the lid. The threaded holes are shown as blind holes, but alternatively are threaded through holes. In an alternative embodiment, the screws are inserted through the lid to threaded holes in the base. Tightening the screws compresses the gasket 54 between the lid 48 and the base 42. The gasket deforms slightly to form an environmental seal and electrically couples the base 42 to the lid 48 to form an electromagnetic seal between the base 42 and the lid 48 and around the high-frequency feedthrough 56.

The bend radius (represented by arrow 49) where the flat lid portion 50 transitions to the sloped lid portion 52 is chosen to be sufficiently large to allow the gasket to conform to both the flat base portion and to the sloped base portion without damage to the gasket. If the bend radius is too small, the gasket will crease or crack, degrading the electromagnetic and/or the environmental seal. It is generally desirable to keep the bend radius small to minimize the footprint of the microcircuit housing. A bend radius of about 60 mils is suitable for a 20 mil gasket. Other radii may be suitable, particularly when using other gasket material or gaskets made of other materials. Alternatively, the corner of the lid is chamfered, such as at an angle of about 45 degrees, with a corresponding chamfer on the base.

Figure 1A:
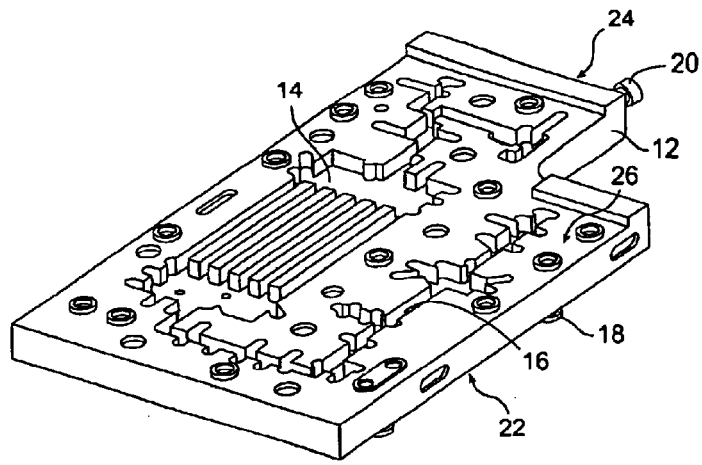
FIG. 1A shows a perspective view of a base of a prior art microcircuit package.
Figure 1B:
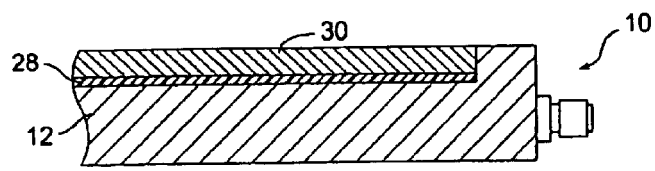
FIG. 1B shows a cross section of a portion of a prior art microcircuit package.
Figure 3A:
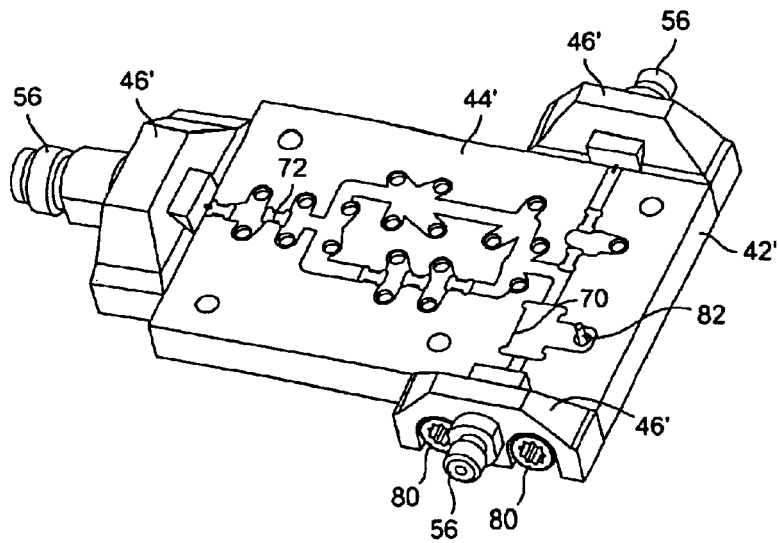
FIG. 3A shows a perspective view of a base for a microcircuit housing according to an embodiment of the present invention.

FIG. 3A shows a perspective view of a base 42' for a microcircuit housing according to an embodiment of the present invention. The base 42, has a flat base portion 44, with optional circuit outlines 70, 72. Some portions 72 of the circuit outline extend about 3 mils above the surface of the flat base portion 44'. Other portions 70 of the circuit outline extend about 3 mils below the surface of the flat base portion 44' to form shallow pockets for mounting electronic components. In an alternative or further embodiment, fiducial marks (not shown) are provided along the optional circuit outline to help position an electronic component(s) on the base 42'. The flat base portion 44, provides an open planar region for assembling electronic components in embodiments without the cavities and channels of conventional canyon-style microcircuit housings (see FIG. 1A, ref. nums. 14, 16). The flat base portion 44' allows convenient access for assembly and testing of the electronic components and other components after they are attached to the base 42', and enables flat, smooth mounting areas for electrical components that are difficult to achieve using conventional techniques.

The sidewall connector features 46' are connected to the flat base portion 44' with screws 80, allowing the sidewall connector features to be separately fabricated. The high-frequency feedthroughs 56 are typically inserted into machined sidewall connector features 46' before the sidewall connector features 46' are attached to the flat base portion 44'. This allows separate testing of the high-frequency connectors, increasing yields of the base 42' of the microcircuit housing. Feedthroughs 82, such as DC feedthroughs or low-frequency feedthroughs that do not require an in-line launch, are optionally provided in the flat base portion 44'.

Figure 3B:
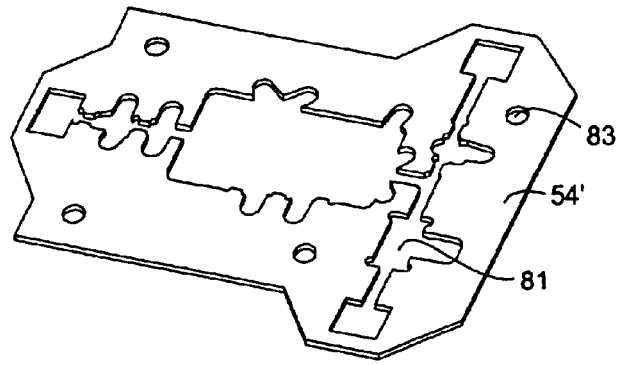
FIG. 3B shows a perspective view of a gasket for the base sown in FIG. 3A.

FIG. 3B shows a perspective view of a gasket 54' for the base 42' shown in FIG. 3A. The gasket 54' has cut-out areas 81 for electronic components (not shown) and holes 83 for screws (not shown) that attach the lid to the base.

Figure 3C:
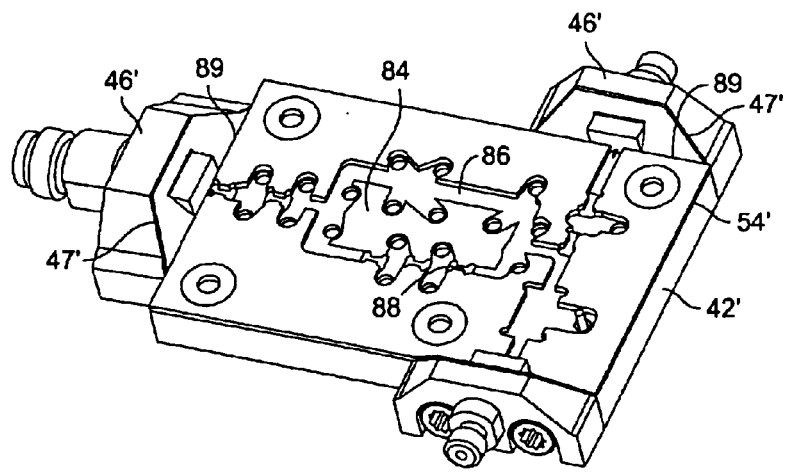
FIG. 3C shows a perspective view of the gasket of FIG. 3B on the base of FIG. 3A.

FIG. 3C shows a perspective view of the gasket 54' of FIG. 3B on the base 42' of FIG. 3A. The gasket 54' is stamped from a sheet of conductive elastomeric material about 20 mils thick. An optional interior gasket 84 provides enhanced electromagnetic isolation between circuit paths 86, 88. The base 42' is shown without microcircuits, which are typically attached to the base with conductive epoxy before installing the gaskets 54', 84, for simplicity of illustration. The gasket 54' assumes the shape of the base 42, by bending (at dotted line 89) to follow a face 47' of the sidewall connector feature 46, in a contiguous fashion to form an environmental and electromagnetic seal between the base 42' (including the sidewall connector features 46') and the lid (see FIG. 3D, ref. num. 92). A contiguous gasket is desirable because electromagnetic radiation can leak through gaps in a multi-part gasket.

Figure 3D:
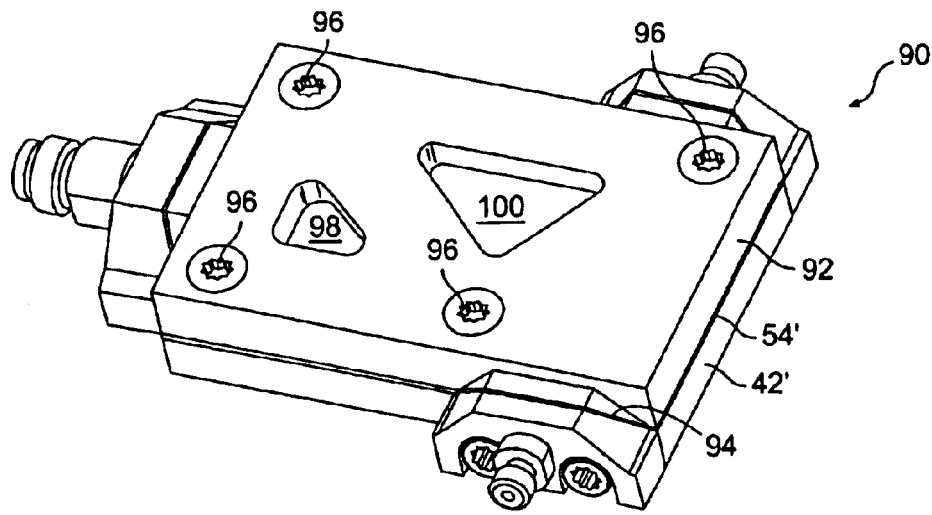
FIG. 3D shows a perspective view of a high-frequency microcircuit with a lid and the base and gasket of FIG. 3C.

FIG. 3D shows a perspective view of a high-frequency microcircuit 90 with a lid 92 and the base 42' and gasket 54' of FIG. 3C. The lid 92 includes sloped lid portions 94 and is attached to the base 42' with four screws 96. Channels (not shown) are formed in the lid to accommodate electronic components and interconnections inside the high-frequency microcircuit 90. Pockets 98, 100 are formed in the lid 92 to reduce the weight of the microcircuit.

Figure 4:
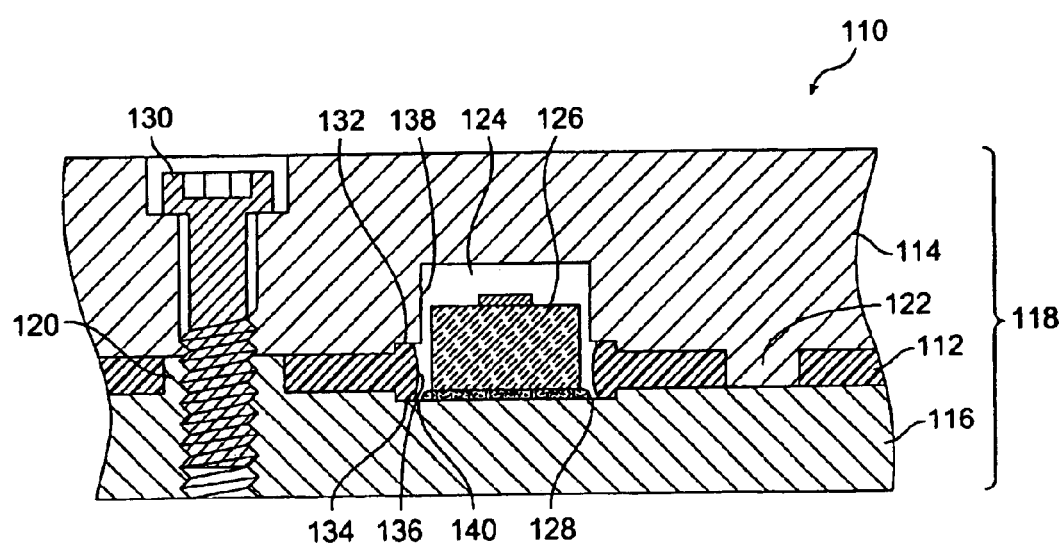
FIG. 4 shows a cross section of a microcircuit according to an embodiment of the present invention.

FIG. 4 shows a cross section of a portion of a microcircuit 110 according to an embodiment of the present invention. A conductive elastomeric gasket 112 is compressed between a lid 114 and a base 116 of the microcircuit housing 118. A stop 120 is incorporated into the base 116 to limit the proximity of the lid 114 to the base 116, which limits the amount of compression of the gasket 112 when the microcircuit housing 120 is assembled. Over-compression of the gasket can damage the gasket and degrade the environmental and/or electromagnetic seal. Alternatively, a stop 122 is incorporated into the lid 114. In yet another embodiment, a washer or sleeve is provided to maintain a selected compression of the gasket. When tightening the screws (only one of which is shown) 130 securing the lid 114 to the base 116, it is preferable to gradually tighten the screws in stages to evenly compress the gasket. In other words, all the screws are first partially tightened, and then tightened to obtain the desired compression of the gasket when the lid and base bottom-out against the stops.

A channel 124 is machined in the lid 114 to accommodate an electrical component 126, in this case a microstrip transmission line, which is attached to the base 116 with conductive adhesive 128. A microstrip transmission line is used only as an example of an electrical component for purposes of discussion. The width of the channel 124 is selected to accommodate the microstrip transmission line 126, and is optionally wider to achieve a desired electrical characteristic of the microstrip transmission line 126 in the microcircuit 110. In a further embodiment, the depth of the channel 124 in the lid 114 (i.e. the height above the channel 124 above the microstrip transmission line 126) is selected to achieve a desired electrical characteristic of the microstrip transmission line in the microcircuit 110. For example, the width and depth of the channel are chosen in some embodiments to form a waveguide, reducing electromagnetic coupling between the electrical component 126 and the package. In a further embodiment, a channel in a lid has a first channel portion with a first width selected to achieve a first selected electrical characteristic (such as a first waveguide) and a second channel portion with a second width selected to achieve a second selected electrical characteristic (such as a second waveguide). Such embodiments typically have two different electrical components in the channel. In another embodiment, a channel in a lid has a first channel portion with a first depth selected to achieve a first electrical characteristic and a second channel portion with a second depth selected to achieve a second electrical characteristic. In a conventional canyon-style microcircuit, the width of a channel is determined by the access needed for assembly tooling, and the height of the channels is determined by the thickness of the base needed to accommodate side-mounted feedthroughs.

A lid set back 132 and a base set-back 134 provide a lateral expansion containment feature to help secure the end 136 of the gasket 112 and keep it from extending into the channel 124 and possibly shorting-out the electrical component 126. The set-backs, which extend back from the wall 138 of the channel 124 about 10 mils, provide a space for the gasket 112 to vertically expand into when the gasket is compressed between the base 116 and lid 114. The base set-back 134 is essentially an extension of the pocket 140 that the electronic component 126 is mounted in. The pocket 140 is about 3 mils deep, as is the lid set-back 132. Alternatively, lateral expansion containment features are provided in the form of small holes drilled in the base and/or lid near the end of the gasket. When the gasket is compressed, it flows laterally between the lid and base, and also vertically into the holes, which also creates a shear stress opposing further lateral expansion.

Providing stops 120, 122 to limit the proximity of the lid 114 to the base 116, and hence the amount of compression of the gasket 112. In one embodiment, the gasket 112 has a thickness of 20 mils before assembly, and a thickness of 16 mils after assembly, which is a 20% reduction in thickness. This amount of deformation forms a desirable environmental and electromagnetic seal between the lid 114 and the base 116 without undue lateral expansion.

While the preferred embodiments of the present invention have been illustrated in detail, it should be apparent that modifications and adaptations to these embodiments might occur to one skilled in the art without departing from the scope of the present invention as set forth in the following claims.

What is claimed is:

1. A microcircuit housing comprising:
   a base having a flat base portion transitioning into a face portion of a sidewall connector feature sloping from the flat base portion;
   a lid having a flat lid portion transitioning into a sloped lid portion; and
   a gasket contiguous between the flat base portion and the face portion of the sidewall connector feature being compressed between the lid and the base to form an electromagnetic seal and an environmental seal between the lid and the base.

2. The microcircuit housing of claim 1 wherein the face portion has a slope angle between 30 degrees and 60 degrees relative to the flat base portion.

3. The microcircuit housing of claim 1 further comprising
   a high-frequency electrical component disposed on the flat base portion; and
   a high-frequency feedthrough extending through the sidewall connector feature to form an in-line launch with the high-frequency electrical component.

4. The microcircuit housing of claim 3 further comprising a channel in the lid having a channel width and a channel depth forming a waveguide to prevent electromagnetic coupling with the package.

5. The microcircuit housing of claim 4 wherein the channel width is selected to provide a desired electrical characteristic of the high-frequency electrical component in the microcircuit housing.

6. The microcircuit housing of claim 5 wherein the channel has a second channel width selected to provide a second desired electrical characteristic.

7. The microcircuit housing of claim 4 wherein the channel depth is selected to provide a desired electrical characteristic of the high-frequency electrical component in the microcircuit housing.

8. The microcircuit housing of claim 7 wherein the channel has a second channel depth selected to provide a second desired electrical characteristic.

9. The microcircuit housing of claim 4 further comprising a lateral expansion containment feature to provide a space for the gasket to vertically expand into when the gasket is compressed between the base and the lid.

10. The microcircuit housing of claim 9 wherein the lateral expansion containment feature includes a lid set-back and a base set-back.

11. The microcircuit housing of claim 1 wherein the gasket is formed from a sheet of conductive elastomer including nickel-plated carbon fibers in a silicon-rubber base.

12. The microcircuit housing of claim 1 further comprising a stop to limit compression of the gasket.

13. The microcircuit housing of claim 5 wherein the stop is integrated with the base.

14. The microcircuit housing of claim 12 wherein the gasket has a thickness and the stop limits the proximity of the lid to the base to not less than 80% of the thickness.

15. The microcircuit housing of claim 1 wherein the flat base portion transitions to the face portion of the sidewall connector feature with a curve having a radius sufficient to allow the gasket to conform to both the flat base portion and to the face portion to form the electromagnetic seal and the environmental seal.

16. A microcircuit housing comprising:
   a base having a flat base portion transitioning into a face portion of a sidewall connector feature forming an angle of between 30 degrees and 60 degrees relative to the flat base portion;
   a lid having a flat lid portion transitioning into a sloped lid portion and a channel formed in the lid proximate to the flat base portion configured to accept an electronic component mounted on the flat base portion; and
   a conductive elastomeric gasket contiguous between the flat base portion and the face portion of the sidewall connector feature and being compressed between the lid and the base to form an electromagnetic seal and an environmental seal between the lid and the base.

17. A microcircuit comprising:
   a base having a flat base portion transitioning into a first face portion of a first sidewall connector feature sloping from the flat base portion;
   a lid having a flat lid portion transitioning into a first sloped lid portion and a channel having;
   a high-frequency electrical component disposed on the flat base portion and extending into the channel wherein the channel has a channel width selected to provide a selected electrical characteristic of the high-frequency electrical component in the channel;
   a high-frequency feedthrough extending through the first sidewall connector feature and electrically coupled to the first high-frequency electrical component to form an in-line launch; and
   a gasket disposed between the base and the lid to form an electromagnetic seal and an environmental seal around the first high-frequency circuit and around the first high-frequency feed-through.

18. The microcircuit of claim 17 further comprising
   a stop to limit the proximity of the base to the lid; and
   a lateral expansion containment feature.

19. The microcircuit of claim 17 further comprising a pocket formed in the base to accept the high-frequency electrical component.

* * * * *